(12) United States Patent
Orita

(10) Patent No.: US 8,060,853 B2
(45) Date of Patent: Nov. 15, 2011

(54) SEMICONDUCTOR INTEGRATED CIRCUIT DESIGNING APPARATUS, SEMICONDUCTOR INTEGRATED CIRCUIT DESIGNING METHOD AND SEMICONDUCTOR DEVICE

(75) Inventor: Hiroshige Orita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 12/108,699

(22) Filed: Apr. 24, 2008

(65) Prior Publication Data

US 2008/0270957 A1 Oct. 30, 2008

(30) Foreign Application Priority Data

Apr. 27, 2007 (JP) ................................. 2007-118420

(51) Int. Cl.
*G06F 17/50* (2006.01)

(52) U.S. Cl. ............ 716/139; 716/50; 716/55; 716/100; 716/119; 716/126

(58) Field of Classification Search ................ 716/8–11, 716/14, 50, 55, 100, 119, 123, 126, 130, 716/139

See application file for complete search history.

(56) References Cited

U.S. PATENT DOCUMENTS

| 3,813,650 | A  | * | 5/1974 | Hunter ............................. 438/6 |
| 4,896,272 | A  | * | 1/1990 | Kurosawa ..................... 716/102 |
| 6,532,579 | B2 | * | 3/2003 | Sato et al. ..................... 716/121 |
| 7,665,049 | B2 | * | 2/2010 | Muranaka ..................... 716/136 |

FOREIGN PATENT DOCUMENTS

| JP | 08-030654   | 2/1996 |
| JP | 2000-056446 | 2/2000 |
| JP | 2002-261163 | 9/2002 |

* cited by examiner

*Primary Examiner* — Sun Lin
(74) *Attorney, Agent, or Firm* — Turocy & Watson, LLP

(57) ABSTRACT

A semiconductor device includes a plurality of logical elements and a plurality of wiring lines. The plurality of wiring lines have a wiring line which connects the logical elements to each other, and a wiring line which is disconnected on one end from one of the logical elements and connected on the other end to another one of the logical elements.

19 Claims, 9 Drawing Sheets

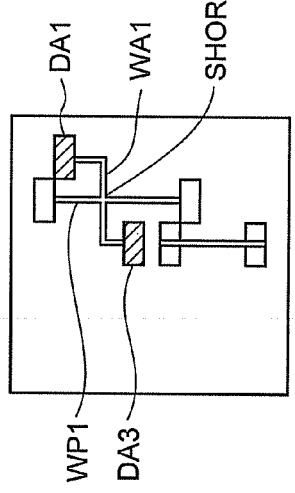

FIG. 4A

INITIAL PLACEMENT OF LOGICAL ELEMENTS

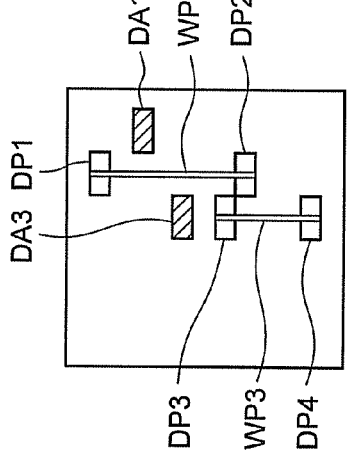

FIG. 4B

WIRING LINE 1 ACCORDING TO CONVENTIONAL TECHNIQUE

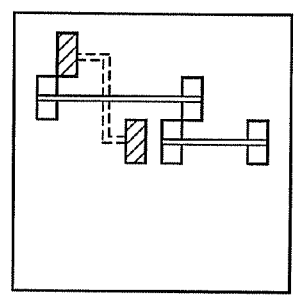

FIG. 4C

WIRING LINE 2 ACCORDING TO CONVENTIONAL TECHNIQUE (EXTENDING OVER TWO LAYERS)

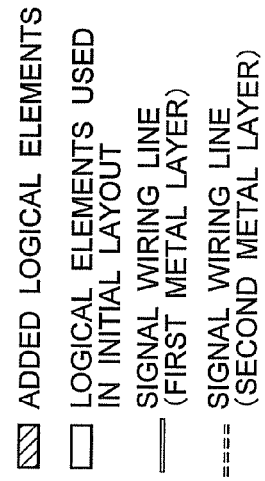

ADDED LOGICAL ELEMENTS

LOGICAL ELEMENTS USED IN INITIAL LAYOUT

SIGNAL WIRING LINE (FIRST METAL LAYER)

SIGNAL WIRING LINE (SECOND METAL LAYER)

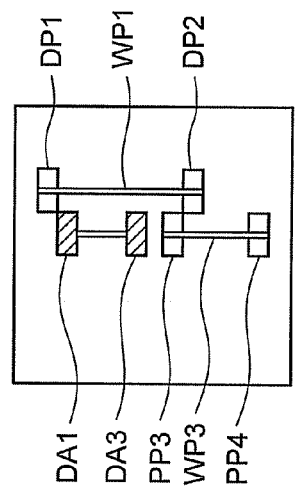

FIG. 4D

ARRANGEMENT POSITION AND ACTUAL WIRING LINE AFTER CHANGE ACCORDING TO PRESENT EMBODIMENT

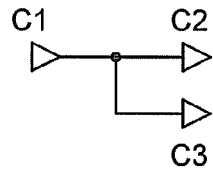
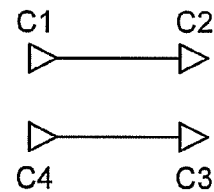
BEFORE ECO
AFTER ECO
FIG. 6A
FIG. 6B
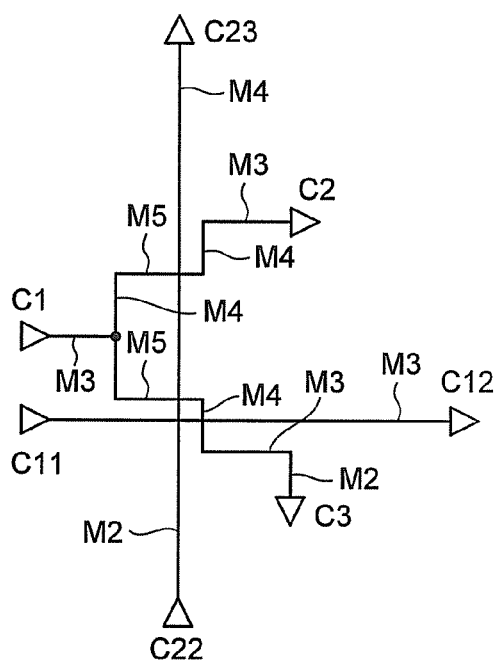
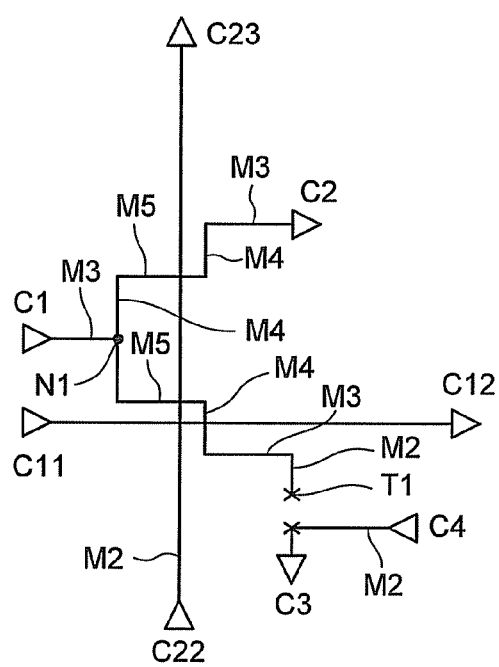
BEFORE ECO
AFTER ECO
FIG. 7A
FIG. 7B

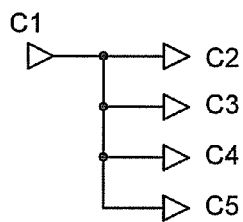
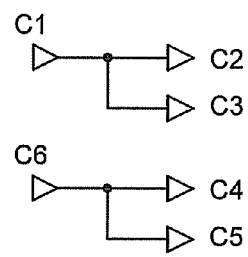
BEFORE ECO
AFTER ECO
FIG. 8A
FIG. 8B
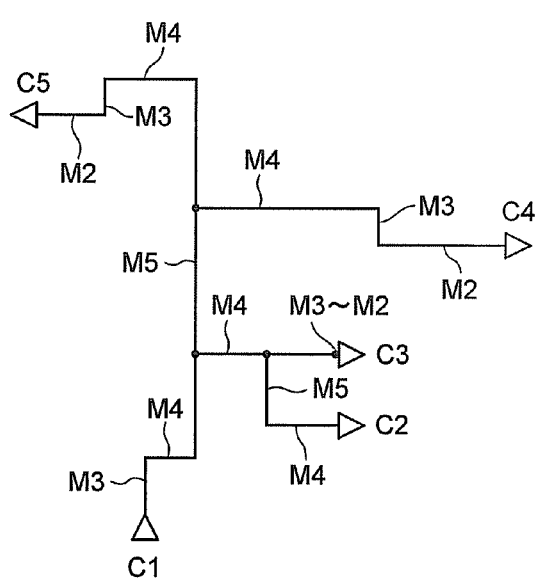
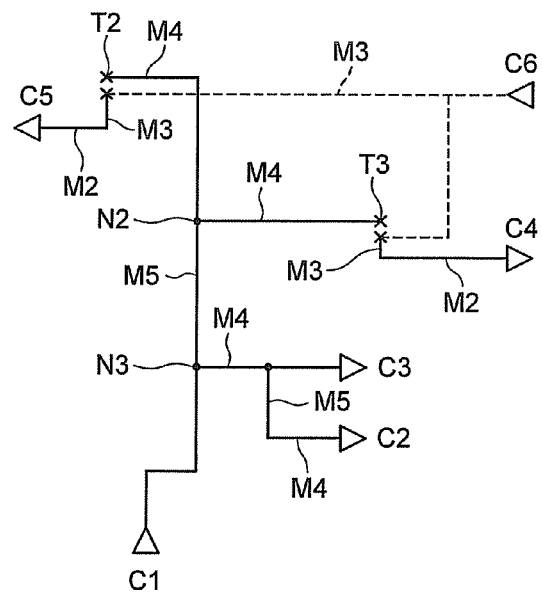
BEFORE ECO
AFTER ECO
FIG. 9A
FIG. 9B

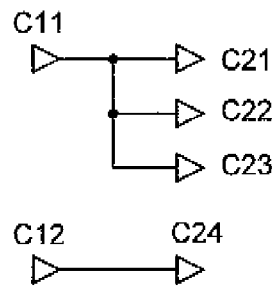
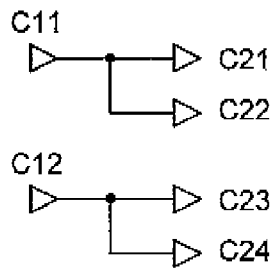
BEFORE ECO
AFTER ECO
FIG.11A
FIG. 11B
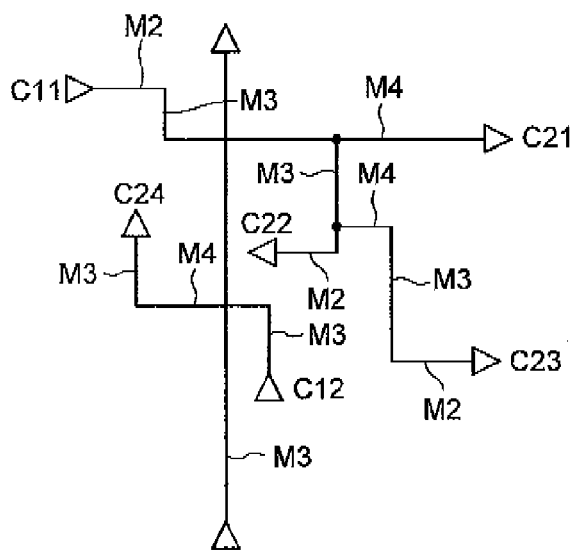
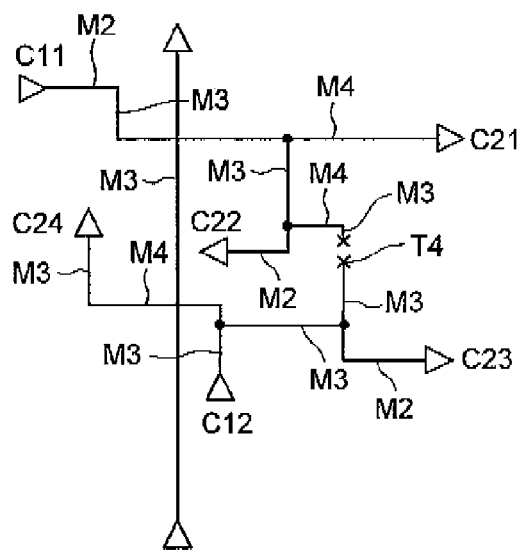
BEFORE ECO
AFTER ECO
FIG.12A
FIG.12B

SEMICONDUCTOR INTEGRATED CIRCUIT DESIGNING APPARATUS, SEMICONDUCTOR INTEGRATED CIRCUIT DESIGNING METHOD AND SEMICONDUCTOR DEVICE

CROSS REFERENCE TO RELATED APPLICATION

This application claims benefit of priority under 35USC §119 to Japanese patent application No. 2007-118420, filed on Apr. 27, 2007, the contents of which are incorporated by reference herein.

BACKGROUND OF THE INVENTION

1. Field of the Invention

The present invention relates to a semiconductor integrated circuit designing apparatus, a semiconductor integrated circuit designing method and a semiconductor device.

2. Related Background Art

In the manufacture of a semiconductor integrated circuit device, an instruction may be given to change its specification or add a function thereto after the making of a mask.

For signal wiring lines of a net added due to a change in a circuit after mask making, two wiring layers are generally used instead of changing all the layers in order to minimize the number of masks changed. The reason is that added logical elements are placed on the basis of global wiring in order to increase the wiring efficiency of signal line and to apply priority wiring directions in the context of the increase of layers in a semiconductor integrated circuit.

However, the problem of conventional techniques is that signal wiring lines of at least two layers are required and the number of masks changed often increases accordingly.

SUMMARY OF THE INVENTION

According to a first aspect of the present invention, there is provided a semiconductor integrated circuit designing apparatus comprising:

a retrieval unit which retrieves, in the case where at least one of a logical element or a wiring line is changed after mask making, placement coordinates or wiring coordinates of the logical element to permit wiring in a specified wiring layer for the changed logical element or wiring line in accordance with circuit change information and information on a layout before the circuit change; and a placement/wiring unit which carries out the placement or wiring of the logical element on the basis of information on the retrieved placement coordinates or wiring coordinates.

According to a second aspect of the present invention, there is provided a semiconductor integrated circuit designing method comprising:

retrieving, in the case where at least one of a logical element or a wiring line is changed after mask making, placement coordinates or wiring coordinates of the logical element to permit wiring in a specified wiring layer for the changed logical element or wiring line in accordance with circuit change information and information on a layout before the circuit change; and carrying out the placement or wiring of the logical element on the basis of information on the retrieved placement coordinates or wiring coordinates.

According to a third aspect of the present invention, there is provided a semiconductor device comprising:

a plurality of logical elements and a plurality of wiring lines, the plurality of wiring lines including a wiring line which connects the logical elements to each other, and a wiring line which is disconnected on one end from one of the logical elements and connected on the other end to another one of the logical elements.

BRIEF DESCRIPTION OF THE DRAWINGS

In the attached drawings:

FIGS. 4A to 4D are schematic diagrams for explaining the effects of the semiconductor integrated circuit designing method shown in FIG. 3;

FIGS. 6A and 6B are circuit diagrams explaining one example of the effects of the semiconductor integrated circuit designing method shown in FIG. 5;

FIGS. 7A and 7B are layout diagrams explaining one example of the effects of the semiconductor integrated circuit designing method shown in FIG. 5;

FIGS. 8A and 8B are circuit diagrams explaining another example of the effects of the semiconductor integrated circuit designing method shown in FIG. 5;

FIGS. 9A and 9B are layout diagrams explaining another example of the effects of the semiconductor integrated circuit designing method shown in FIG. 5;

FIGS. 11A and 11B are circuit diagrams explaining one example of the effects of the semiconductor integrated circuit designing method shown in FIG. 10; and FIGS. 12A and 12B are layout diagrams explaining one example of the effects of the semiconductor integrated circuit designing method shown in FIG. 10.

DETAILED DESCRIPTION OF THE INVENTION

Embodiments of the present invention will hereinafter be described with reference to the drawings.

(1) Semiconductor Integrated Circuit Designing Apparatus

Figure 1:
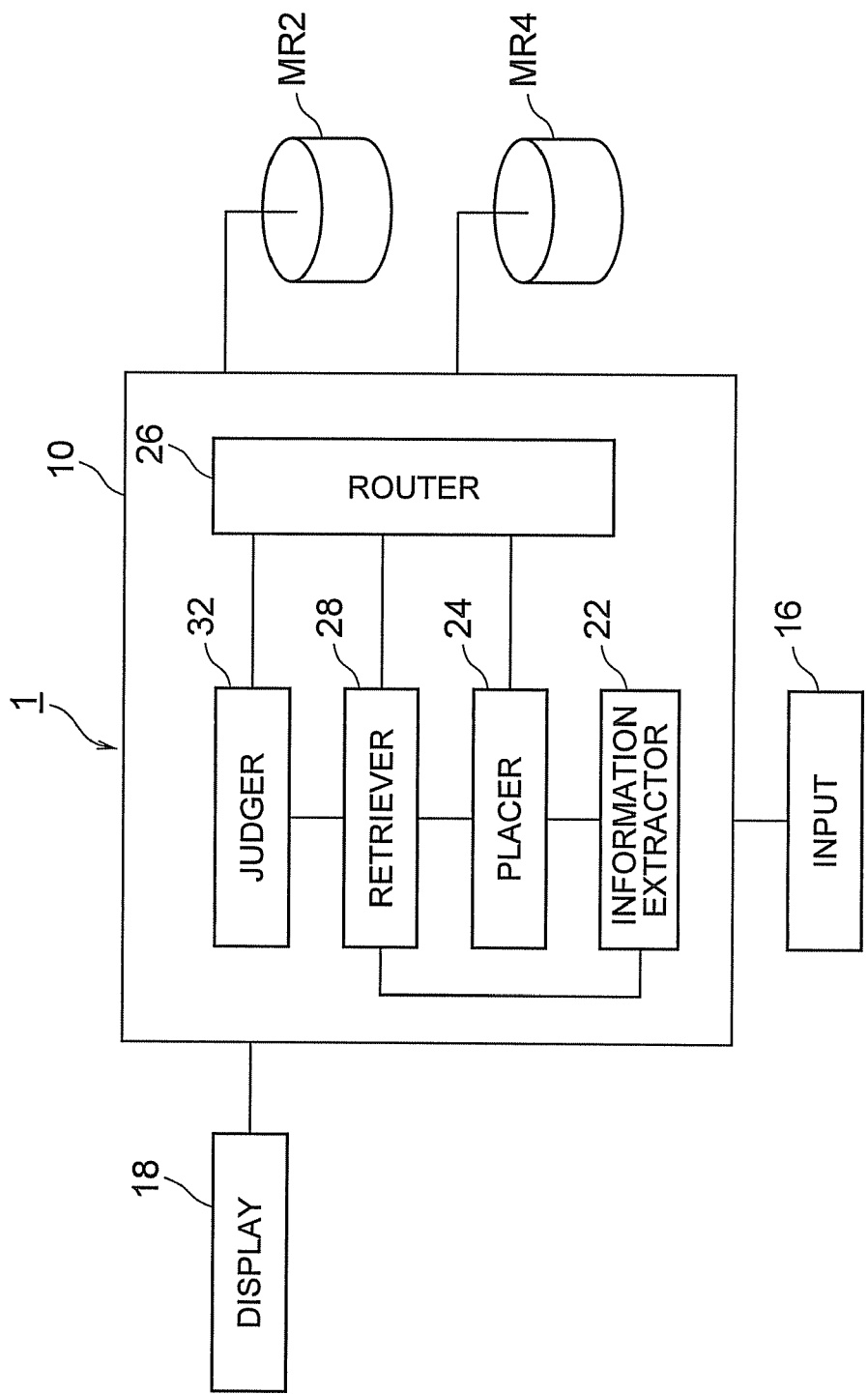
FIG. 1 is a block diagram showing a schematic configuration in one embodiment of a semiconductor integrated circuit designing apparatus according to the present invention.

FIG. 1 is a block diagram showing a schematic configuration in one embodiment of a semiconductor integrated circuit designing apparatus according to the present invention. A designing apparatus 1 shown in FIG. 1 comprises an engineering work station (EWS) 10, external memory units MR2, MR4 such as hard disks, an input 16 and a display 18.

The external memory unit MR2 stores a recipe file in which there is written a series of procedures in the embodiments of a semiconductor integrated circuit designing method according to the present invention described later. The external memory unit MR2 is connected to the EWS 10, and an unshown controller of the EWS 10 reads the recipe file, and then the recipe file is stored in an unshown buffer memory, so that circuit designing is carried out by the EWS 10 in accordance with the series of written procedures. The external memory unit MR4 stores a database for design information before and after a circuit change (an engineering change order, hereinafter simply referred to as an "ECO"). This database includes, for example, a floor plan before the ECO, placement information for logical elements before the ECO, a wiring line before the ECO, etc., in addition to net lists before and after the ECO. The external memory unit MR4 is also connected to the EWS 10, and the information in the database is read by the EWS 10. In addition, while the recipe file and the design information are stored in the external memory units in the present embodiment, the present invention does not have to be limited to this at all. The recipe file and the design information may be previously stored in an internal memory unit, or may be downloaded as needed using a wired or wireless line such as the Internet.

The input 16 is connected to the EWS 10, and is an interface for inputting ECO information such as the net list after the ECO to the EWS 10.

The display 18 is connected to the EWS 10, and displays, as required, an image of, for example, the result of a simulation of actual wiring described later on, for example, a liquid crystal screen in response to the supply of image information from the EWS 10.

The EWS 10 includes an information extractor 22, a placer 24, a router 26, a retriever 28 and a judger 32. The information extractor 22 is connected to the placer 24 and the retriever 28, and extracts information necessary for ECO processing, for example, extracts change information from the design information before and after the ECO loaded from the external memory unit MR4 by comparing the net lists. The circuit change information may be directly input by, for example, a keyboard from the input 16.

The placer 24 is connected to the router 26 and the retriever 28 as well as the information extractor 22, and places additional logical elements at specified placement coordinates on the basis of the information sent from the information extractor 22 or a detection result sent from the retriever 28.

The router 26 is connected to the retriever 28 and the judger 32 as well as the placer 24. The router 26 provides the retriever 28 with information on, for example, the floor plan before the ECO and the wiring line before the ECO, and, on the basis of such wiring information, carries out simulative actual wiring for the logical elements placed by the placer 24, and then supplies the result to the judger 32. Here, the calculation of a global wiring path performed in the router 26 comprises calculating a wiring path on the basis of information on the connection of the logical elements, and calculating a wiring path which ensures a wiring space. The wiring line obtained by this calculation is called "global wiring line" or "global routing line". Moreover, the calculation of a detailed wiring path performed in the router 26 comprises allocating wiring layers in accordance with the global wiring path and thereby calculating the width and wiring layer and positions of wring lines for actual use in a mask. The wiring information obtained by this calculation is called detailed wiring line or actual wiring line.

The judger 32 judges whether wiring is possible in response to the result of wiring by the router 26. When judger 32 judges that wiring is impossible, the judger 32 supplies the retriever 28 with the result of the judgment. In response to the result of the judgment by the judger 32, the retriever 28 retrieves the positions of the logical elements which can be wired or a coordinate position where the logical elements can be connected.

The placer 24, the router 26 and the judger 32 correspond to, for example, means for carrying out the placement or wiring of the logical elements in the present embodiment.

An ECO processing method using the designing apparatus 1 shown in FIG. 1 is explained with reference to FIG. 2 to FIG. 10 as embodiments of the semiconductor integrated circuit designing method according to the present invention.

(2) Semiconductor Integrated Circuit Designing Method (i) First Embodiment

Figure 2:
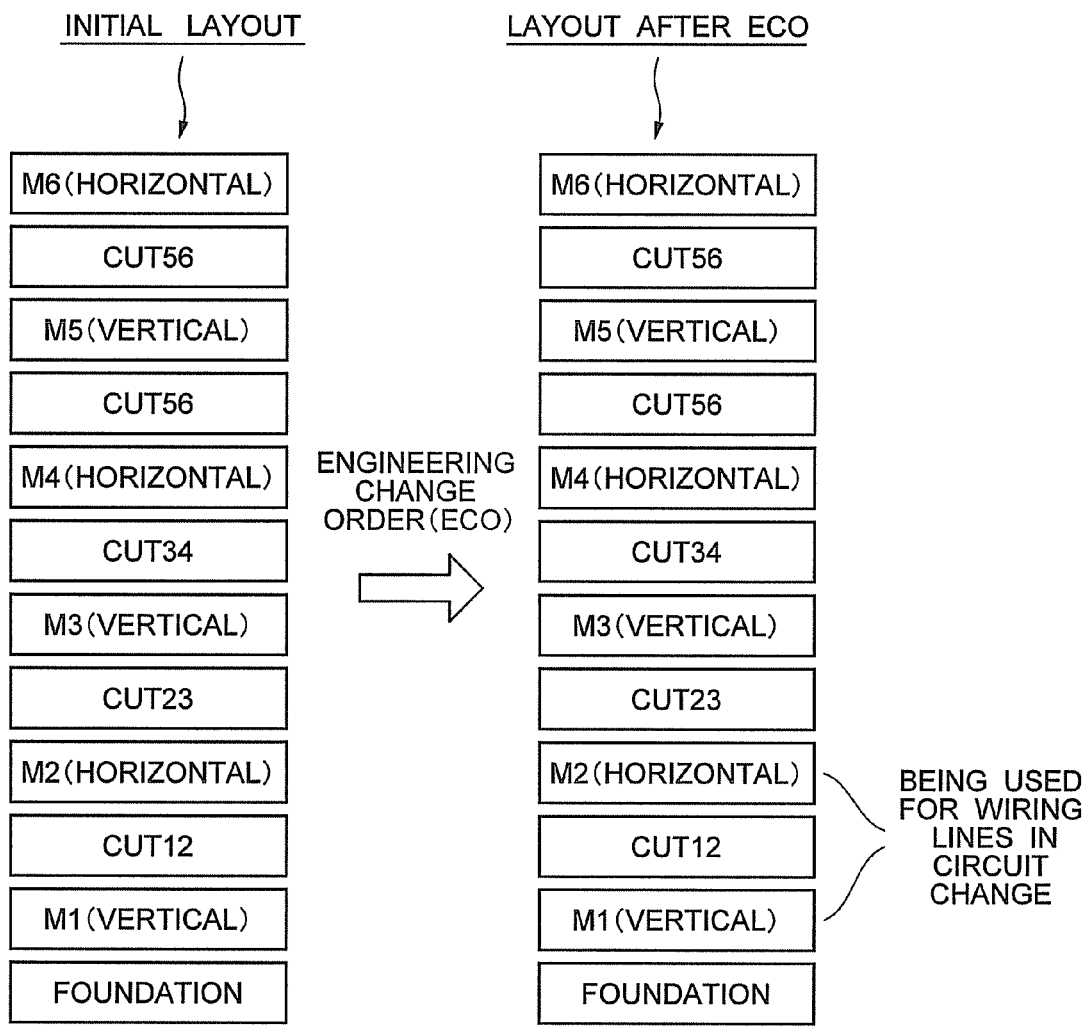
FIG. 2 is a schematic diagram showing wiring layers of a semiconductor integrated circuit device to which the embodiment of the semiconductor integrated circuit designing apparatus according to the present invention is applied.

FIG. 2 is a schematic diagram showing wiring layers of a semiconductor integrated circuit device to which a first embodiment of the semiconductor integrated circuit designing method according to the present invention is applied. In the example shown in FIG. 2, the ECO is executed using a first metal layer (vertical), a second metal layer (horizontal), a third metal layer (vertical), a fourth metal layer (horizontal), a fifth metal layer (vertical) and a sixth metal layer (horizontal).

Figure 3:
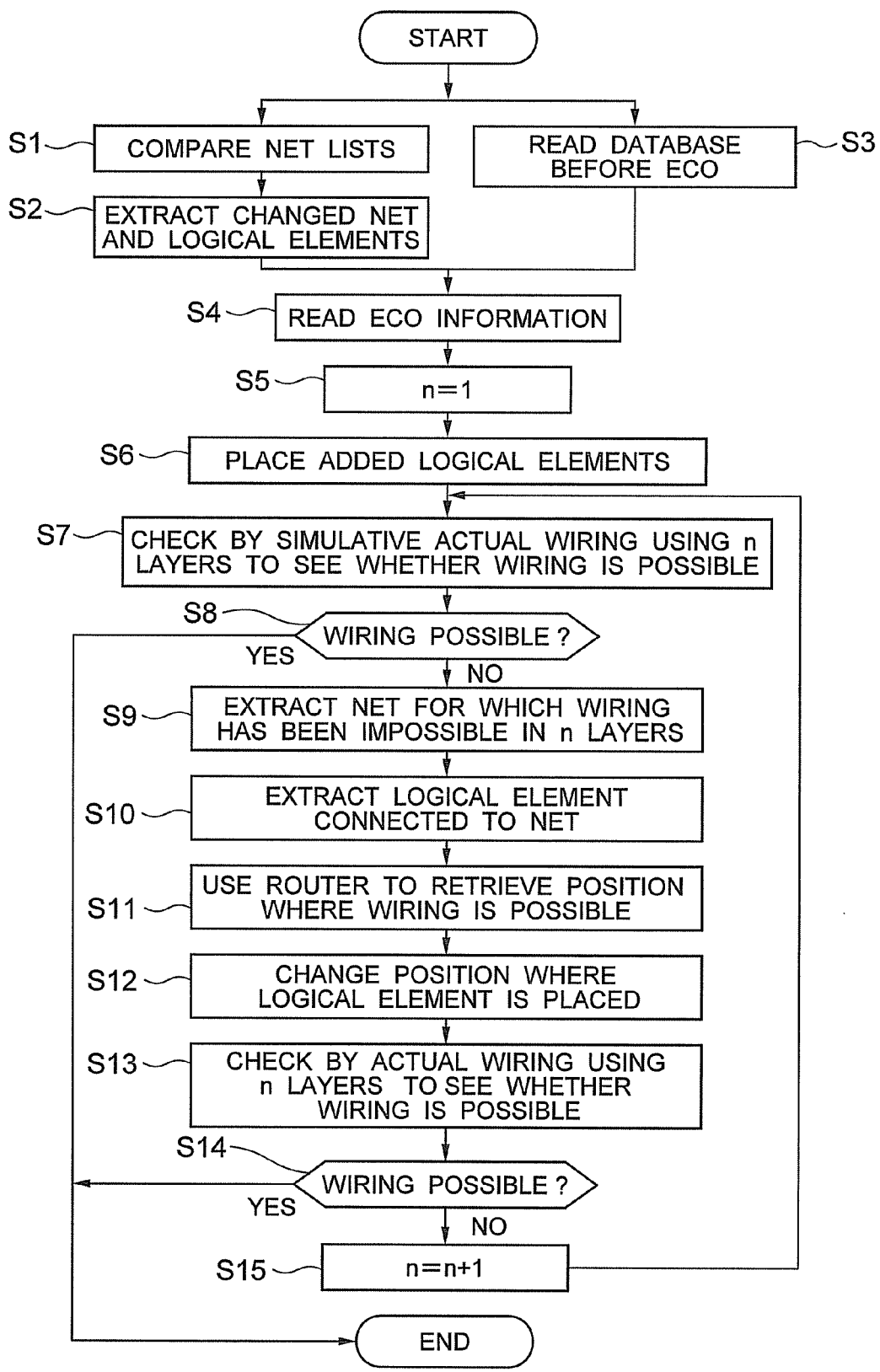
FIG. 3 is a flowchart showing a schematic procedure of a semiconductor integrated circuit designing method according to a first embodiment of the semiconductor integrated circuit designing method of the present invention.

FIG. 3 is a flowchart showing a schematic procedure of the semiconductor integrated circuit designing method according to the present embodiment.

First, the information extractor 22 compares the net lists before and after the ECO (step S1), and extracts a changed net and logical elements (step S2). Before and after or in parallel with these procedures, the information extractor 22 reads the database before the ECO (step S3), and reads, as the ECO information, the floor plan before the ECO, the element placement before the ECO and the wiring information before the ECO as well as information on the additional logical elements and on how these logical elements are wired relative to each other (step S4).

Then, n=1 is set (step S5). In the present embodiment, n indicates the number of metal layers which is the number of wiring layers ($1 \leq n \leq 6$). Further, the placer 24 places the added logical elements (step S6), and the router 26 carries out simulative actual wiring to see whether wiring is possible in one wiring layer. The result of the simulation may be displayed on the display 18. The placement here is carried out using the global wiring line.

Then, the judger 32 judges whether the added logical elements can be wired in one wiring layer (step S8). When all the added logical elements can be wired in one wiring layer, the ECO processing is finished.

On the other hand, when there is an element which can not be wired in one wiring layer among the added logical elements, a corresponding net is extracted (step S9), and a logical element connected to the extracted net is further extracted (step S10), and then the retriever 28 uses a router to retrieve another position where wiring is possible in one wiring layer (step S11).

Then, the position of the logical element is changed to the retrieved wiring position (step S12), and whether wiring is possible in one wiring layer is again checked by a simulation (step S13). When it is ascertained that wiring is possible (step S14), the ECO processing is finished.

On the other hand, when wiring is not possible in one wiring layer (step S14), a counter (not shown) is incremented to set n=2 (=1+1), and the above-described procedures from step S7 to step S14 are repeated until it is ascertained that all the additional logical elements can be wired.

The effects of the ECO processing in the present embodiment are explained with reference to layout diagrams in FIGS. 4A to 4D. As shown in FIG. 4A, in an initial layout, logical elements DP1 and DP2 connected to a wiring line WP1 and logical elements DP3 and DP4 connected to a wiring line WP3 are placed. Here, in the case where logical elements DA1 and DA3 are added due to a design change after mask making, if these logical elements are placed on the basis of the global wiring line and then wired in the same wiring layer (first metal layer) as shown in FIG. 4A in accordance with the conventional technique, a wiring line WA1 connecting the additional logical elements DA1 and DA3 cause a short circuit with the wiring line WP1 in the initial layout, as shown in FIG. 4B. In this case, the conventional technique has to use a lower or upper wiring layer (the second metal layer here) to connect the additional logical elements DA1 and DA3, so that wiring extends over two layers, and the number of masks changed is increased accordingly.

In contrast, the present embodiment judges that wiring in the same wiring layer is impossible in the placement using the detailed wiring path (steps S7, S8), and retrieves a position where wiring is possible (step S11), and then changes the position to place the additional logical element DA1, DA3 (step S11). Thus, as shown in FIG. 4D, the logical elements DA1 and DA3 can be added without any short circuit with the wiring line WP1 in the initial layout in the same wiring layer, such that one mask has only to be changed.

Thus, according to the present embodiment, the initial placement of the additional logical elements is carried out using the detailed wiring path, and whether these logical elements can be wired is judged at the same time. If the logical elements can not be wired, another position where these logical elements can be wired is searched for, so that it is possible to achieve at the short runtime of the ECO processing in which the number of masks changed is reduced.

(ii) Second Embodiment

A second embodiment of the semiconductor integrated circuit designing method according to the present invention is explained with reference to FIG. 5 to FIG. 9. The present embodiment is suitable to the change case of wiring in an initial layout together with the addition of logical elements as a change in a circuit after a mask making. Moreover, the global wiring path is not used, and the detailed wiring path is used. This holds true with a third embodiment subsequently described.

Figure 5:
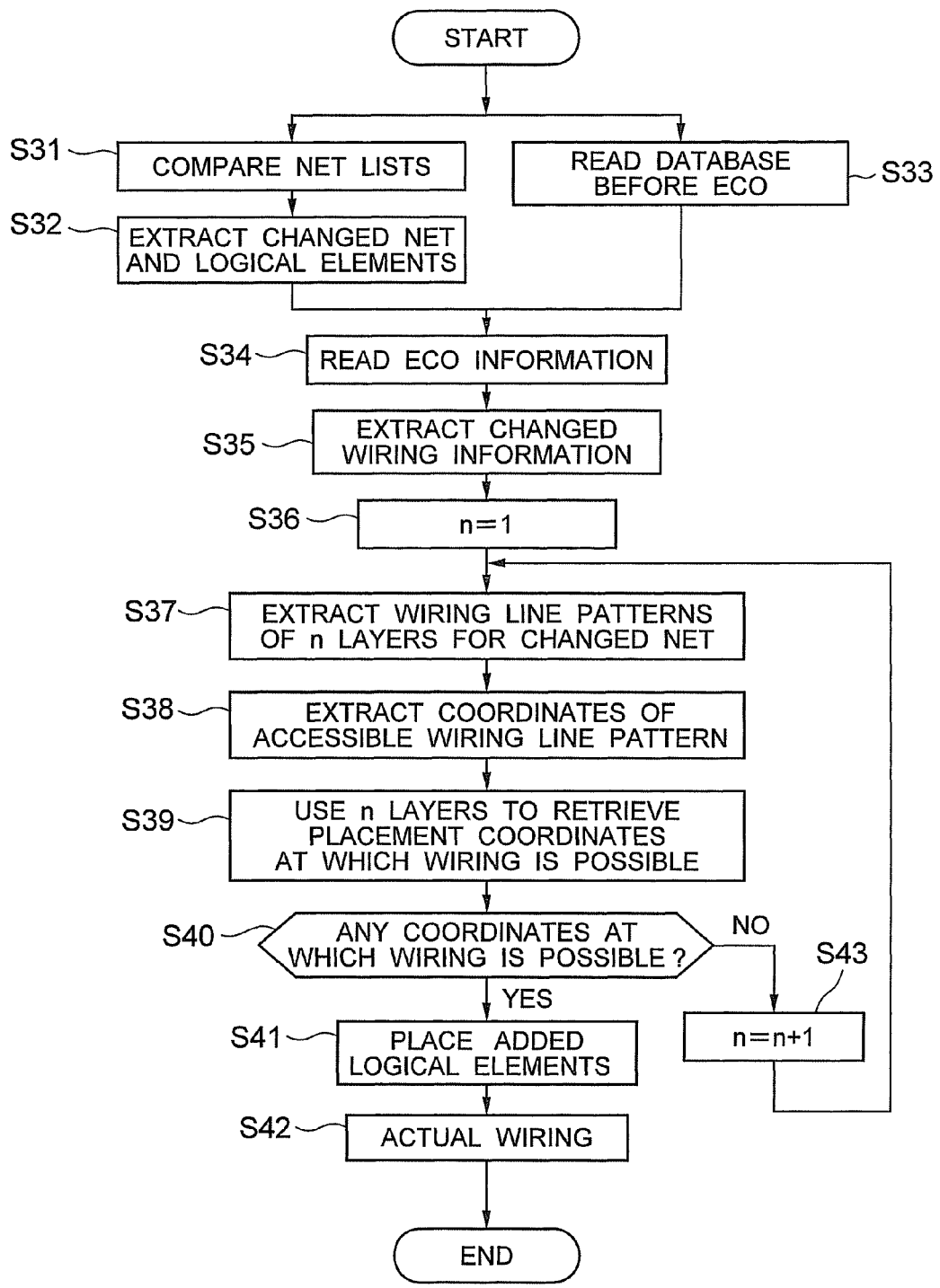
FIG. 5 is a flowchart showing a schematic procedure of a semiconductor integrated circuit designing method according to a second embodiment of the semiconductor integrated circuit designing method of the present invention.

FIG. 5 is a flowchart showing a schematic procedure of a semiconductor integrated circuit designing method according to the present embodiment.

Procedures (steps S31 to S34) substantially similar to those in the first embodiment are performed in the comparison of the net lists before and after the ECO, the extraction of a changed net, the reading of the database before the ECO and the reading of the ECO information by the information extractor 22 of the designing apparatus 1 (see FIG. 1), and the number of these steps correspond to those of the equivalent steps in FIG. 3 to which 30 is added. Therefore, the following explanation begins with step S35.

Specifically, the information extractor 22 extracts changed wiring information from the read ECO information (step S35).

Then, n=1 is set (step S36), and the information extractor 22 extracts the wiring line pattern of one wiring layer for the changed net (step S37).

Then, the information extractor 22 extracts coordinates of an accessible wiring line pattern for the ECO (step S38).

Subsequently, the retriever 28 searches for a position where wiring is possible in one wiring layer (step S39), and the judger 32 judges whether there are any coordinates at which additional logical elements can be placed (step S40).

When there are coordinates at which the additional logical elements can be placed, the placer 24 places the additional logical elements at the coordinates (step S41), and the router 26 carries out actual wiring (step S42), so that the ECO processing is finished. On the other hand, when there are no coordinates in the first wiring layer at which the additional logical elements can be placed, n=n+1 is set (step S43), and the above-described procedures from step S37 to step S40 are repeated in a plurality of wiring layers until coordinates at which the additional logical elements can be placed are found.

One example of the effects of the designing method according to the present embodiment is briefly explained with reference to FIG. 6A to FIG. 7B. FIGS. 6A and 6B are circuit diagrams showing part of the circuit before and after the ECO. While both logical elements C2 and C3 are connected to a logical element C1 before the ECO as shown in FIG. 6A, a logical element C4 is newly added and the logical element C3 is connected to the logical element C4 due to a design change after mask making as shown in FIG. 6B.

FIGS. 7A and 7B are layout diagrams specifically showing the coordinates of the logical elements and wiring paths before and after the ECO to correspond to the circuit diagrams in FIGS. 6A and 6B. In FIGS. 7A and 7B, signs M2 to M4 indicate a second metal layer to a fourth metal layer, respectively. Moreover, directions of full lines in FIGS. 7A and 7B indicate wiring directions. This holds true with full lines and dotted lines in FIGS. 9A and 9B and FIGS. 12A and 12B.

As shown in FIG. 7B, coordinates in the vicinity of the logical element C3 in the second metal layer M2 are extracted as coordinates of an accessible wiring line pattern, and in this wiring layer, a wiring position where the logical element C4 can be wired is searched for. As a result, the logical element C1 is disconnected partway from the logical element C3 in the second metal layer M2, and the additional logical element C4 is placed in the same second metal layer M2, and moreover, the logical element C4 is wired with the logical element C3.

Thus, in the example shown in FIG. 7B, it is obvious that the placement of the additional logical element and the associated wiring change are achieved in the second metal layer M2, and there is no change in the third metal layer M3 to the fifth metal layer M5, so that the ECO processing is finished with the mask change in the second metal layer M2 alone. In addition, no wiring line is needed from a node N1 in the third metal layer M3 to a breaking point T1 in the second metal layer M2 due to the operation of the device in FIG. 7B, but the elimination of this wiring line might change adjacent capacity and shifts timing, so that this wiring line is intentionally kept intact. This makes it possible to deal with a circuit change with the minimum number of masks changed and without affecting the circuit characteristics.

Another example of the effects of the designing method according to the present embodiment is briefly explained with reference to FIG. 8A to FIG. 9B. FIGS. 8A and 8B are circuit diagrams showing part of the circuit before and after the ECO in the present example. The logical elements C2 to C5 are connected to the common logical element C1 before the ECO as shown in FIG. 8A. After the ECO, a logical element C6 is newly added and the logical elements C4 and C5 are connected to the logical element C6 as shown in FIG. 8B.

FIGS. 9A and 9B are layout diagrams specifically showing the element placement and wiring paths before and after the ECO to correspond to the circuit diagrams in FIGS. 8A and 8B. In FIGS. 9A and 9B, signs M2 to M5 indicate a second metal layer to a fifth metal layer, respectively. As shown in FIG. 9B, coordinates in the third metal layer M3 in the right of the drawing are extracted as coordinates of an accessible wiring line pattern, and in this wiring layer, an placement position where a logical element C6 can be wired is searched for. As a result, a logical element C1 is disconnected partway from logical elements C5, C4 in the third metal layer M3 at breaking points T2 and T3. Further, an additional logical element C6 is placed in the same third metal layer M3, and the logical element C6 is wired with the logical elements C4, C5n as indicated by the dotted lines in FIG. 9B. This can deal with the ECO by changing only the mask corresponding to the third metal layer M3.

In the example shown in FIG. 9B as well, unnecessary wiring lines (between T2 and T3 and between N2 and N3) remain in the fourth metal layer M4 and the fifth metal layer M5, but these wiring lines are intentionally kept intact to prevent, for example, the change of adjacent capacity. This proves that, in the present example as well, it is possible, according to the designing method of the present embodiment, to deal with the ECO with the minimum number of masks changed and without affecting the circuit characteristics.

(iii) Third Embodiment

A third embodiment of the semiconductor integrated circuit designing method according to the present invention is explained with reference to FIG. 10 to FIG. 12B. The present embodiment is suitable to the case of the mere change of wiring line in an initial layout with no addition of logical elements as a change in a circuit after a mask making.

Figure 10:
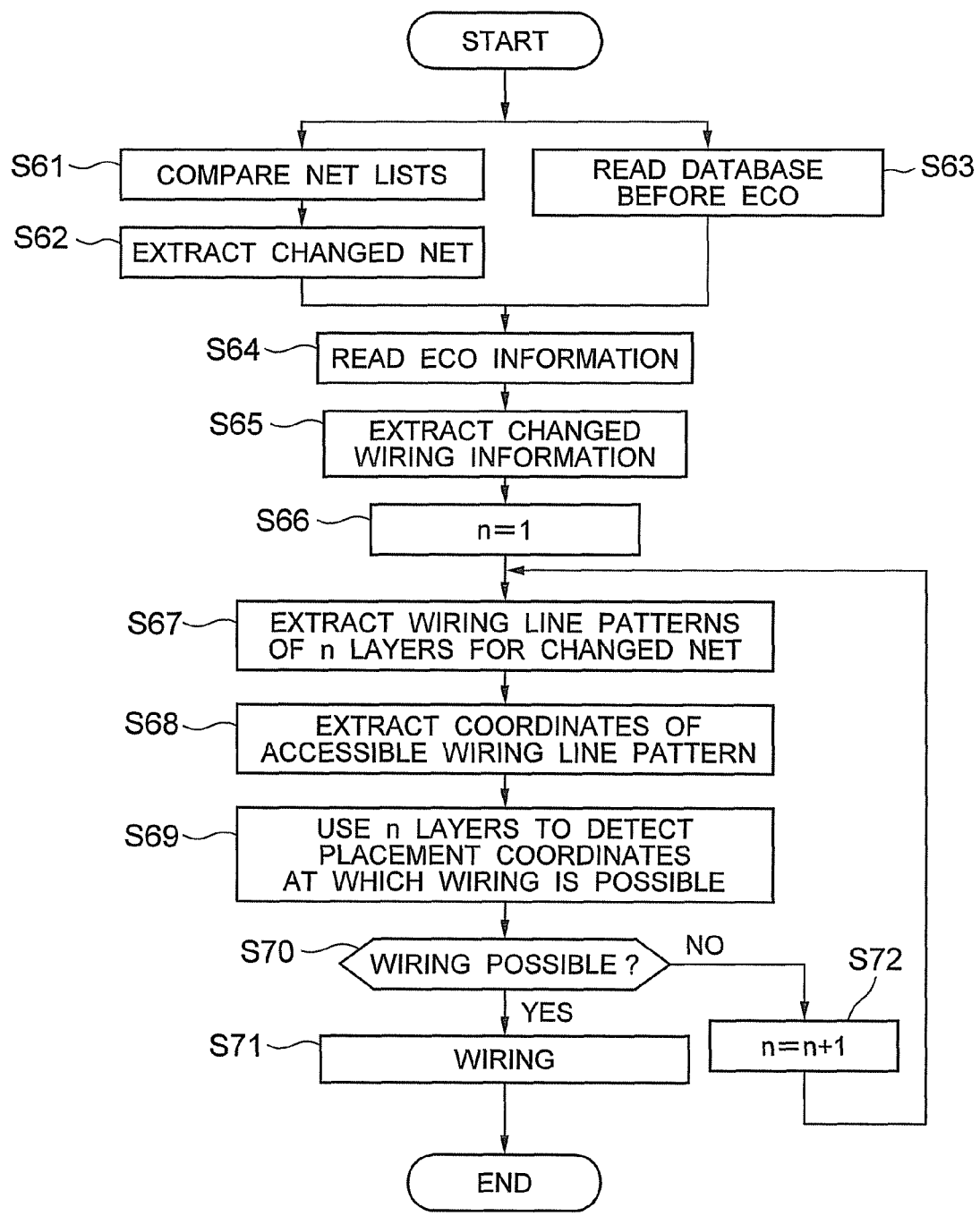
FIG. 10 is a flowchart showing a schematic procedure of a semiconductor integrated circuit designing method according to a third embodiment of the semiconductor integrated circuit designing method of the present invention.

FIG. 10 is a flowchart showing a schematic procedure of the semiconductor integrated circuit designing method according to the present embodiment. As apparent from the comparison with FIG. 5, procedures (steps S61 to S68) substantially similar to those in the second embodiment are performed in the comparison of the net lists before and after the ECO, the extraction of a changed net, the reading of the database before the ECO, the reading of the ECO information, the extraction of changed wiring information, the extraction of a wiring line pattern in the n-th wiring layer, and the extraction of coordinates of an accessible wiring line pattern. The numbers of these steps correspond to those of the equivalent steps in FIG. 5 to which 30 is added. The following explanation begins with step S69.

Specifically, the retriever 28 searches for coordinates at which the logical elements can be connected in one wiring layer from the extracted coordinates of the accessible wiring line patterns (step S69). Then, the judger 32 judges whether wiring is possible (step S70), and if possible, actual wiring is carried out (step S71), and the ECO processing is finished. On the other hand, when it is judged that wiring is not possible in the first wiring layer (step S70), n=n+1 is set (step S72), and the above-described procedures from step S67 to step S70 are repeated in the upper wiring layers until coordinates of the wiring line pattern at which wiring is possible are found.

One example of the effects of the designing method according to the present embodiment is briefly explained with reference to FIG. 11A to FIG. 12B. FIGS. 11A and 11B are circuit diagrams showing part of the circuit before and after the ECO. Before the ECO, as shown in FIG. 11A, logical elements C21 and C23 are connected to a common logical element C11, and a logical element C12 and a logical element C24 are connected to each other. Due to a design change after mask making, as shown in FIG. 11B, the logical element to which the logical element C23 is connected is changed from the logical element C11 to the logical element C12.

FIGS. 12A and 12B are layout diagrams specifically showing the element placement and wiring paths before and after the ECO to correspond to the circuit diagrams in FIGS. 11A and 11B. In FIGS. 12A and 12B as well, signs M2 to M4 indicate a second metal layer to a fourth metal layer, respectively. As shown in FIG. 12B, coordinates in the third metal layer M3 along the horizontal direction in the lower side of the drawing are extracted as coordinates of an accessible wiring line pattern, and in this third metal layer M3, a coordinate position is searched for to connect the C23 to the logical element C12, such that these logical elements are wired with each other. The logical element C23 is disconnected partway from the logical element C11 in the third metal layer M3 at a breaking point T4. This can deal with the ECO by changing only the mask corresponding to the third metal layer M3.

(3) Program

A series of procedures of the semiconductor integrated circuit designing method according to the first to third embodiments described above may be incorporated into a program to be executed by a computer, and stored in a recording medium such as a flexible disk or a CD-ROM, and then read into and executed by the computer. This makes it possible to achieve the semiconductor integrated circuit designing method according to the present invention by use of a general-purpose computer. The recording medium is not limited to a portable medium such as a magnetic disk or an optical disk, and may be a fixed recording medium such as a hard disk drive or a memory. Further, the program incorporating the series of procedures of the semiconductor integrated circuit designing method described above may be distributed via a communication line (including wireless communication) such as the Internet. Moreover, the program incorporating the series of procedures of the semiconductor integrated circuit designing method described above may be distributed in an encrypted, modulated or compressed state via a wired or wireless line such as the Internet or in a manner stored in a recording medium.

(4) Semiconductor Device Manufacturing Method

If the semiconductor integrated circuit designing method according to the first to third embodiments described above is applied to the ECO processing, it is possible to manufacture a semiconductor device in which an integrated circuit after a change is formed with the minimum number of masks changed and without affecting the circuit characteristics. It is thus possible to manufacture a semiconductor device in a short turn around time (TAT) and at low cost.

(5) Semiconductor Device

If the semiconductor integrated circuit designing method according to the second and third embodiments described above is applied to the ECO processing, a semiconductor device comprising a plurality of logical elements is provided, wherein part of a wiring line connecting the logical elements is cut off, one end of which being disconnected from the logical element, the other end of which being connected to another logical element, as shown in FIG. 7B, FIG. 9B and FIG. 12B.

What is claimed is:

1. A semiconductor integrated circuit designing apparatus comprising:

a retrieval unit which retrieves, in a case of a circuit change on a semiconductor integrated circuit device where at least one of a logical element or a wiring line is changed after mask making, placement coordinates or wiring coordinates of logical elements in the semiconductor integrated circuit device to permit wiring in a specified wiring layer for the changed logical element or the changed wiring line in accordance with circuit change information and information on a layout before the circuit change; and a placement/wiring unit which carries out placement or wiring of the logical elements based on information on the retrieved placement coordinates or the retrieved wiring coordinates.

2. The designing apparatus according to claim 1, wherein the circuit change includes adding logical elements wiring the added logical elements, the placement/wiring unit includes a judger which judges whether the wiring is possible in the specified wiring layer in accordance with the retrieved placement coordinates of the logical elements, and when the judger judges that the wiring is impossible in the specified wiring layer, the retrieval unit increases number of specified wiring layers, and retrieves placement coordinates or wiring coordinates of the logical elements in a plurality of wiring layers until the wiring of the added logical elements is permitted.

3. The designing apparatus according to claim 1, wherein the circuit change includes adding additional logical elements and changing existing wiring lines due to the additional logical elements, the placement/wiring unit includes a judger which judges whether there are any coordinates which permit the additional logical elements to be placed in the specified wiring layer in accordance with the retrieved placement coordinates of the logical elements, and when the judger judges that there are no coordinates which permit the additional logical elements to be placed in the specified wiring layer, the retrieval unit increases number of specified wiring layers, and retrieves placement coordinates or wiring coordinates of the logical elements in a plurality of wiring layers until coordinates which permit the additional logical elements to be placed are specified.

4. The designing apparatus according to claim 3, wherein the judger uses a detailed wiring path to judge whether there are any coordinates which permit the additional logical elements to be placed.

5. The designing apparatus according to claim 1, wherein the circuit change includes a change of wiring lines, the placement/wiring unit includes a judger which judges whether there are any wiring coordinates which permit the wiring in the specified wiring layer in accordance with the retrieved wiring coordinates, and when the judger judges that there are no wiring coordinates which permit wiring in the specified wiring layer, the retrieval unit increases number of specified wiring layers, and retrieves the wiring coordinates for a plurality of wiring layers until wiring coordinates which permit the wiring are specified.

6. The designing apparatus according to claim 5, wherein the judger uses a detailed wiring path to judge whether there are any wiring coordinates which permit wiring.

7. A semiconductor integrated circuit designing method comprising:

retrieving, by a computer, in a case of a circuit change on a semiconductor integrated circuit device where at least one of a logical element or a wiring line is changed after mask making, placement coordinates or wiring coordinates of logical elements in the semiconductor integrated circuit device to permit wiring in a specified wiring layer for the changed logical element or the changed wiring line in accordance with circuit change information and information on a layout before the circuit change; and carrying out, by the computer, placement or wiring of the logical elements based on information on the retrieved placement coordinates or the retrieved wiring coordinates.

8. The semiconductor integrated circuit designing method according to claim 7, wherein the circuit change includes adding logical elements and wiring the added logical elements, carrying out, by the computer, placement or wiring of the logical elements includes judging whether the wiring is possible in the specified wiring layer in accordance with the retrieved placement coordinates of the logical elements, and when it is judged that wiring is impossible in the specified wiring layer, the method further comprises increasing, by the computer, number of specified wiring layers, and retrieving, by the computer, placement coordinates or wiring coordinates of the logical elements in a plurality of wiring layers until the wiring of the added logical elements is permitted.

9. The semiconductor integrated circuit designing method according to claim 7, wherein the circuit change includes adding additional logical elements and changing existing wiring lines due to the additional logical elements, carrying out, by the computer, the placement or the wiring of the logical elements includes judging whether there are any coordinates which permit the additional logical elements to be placed in the specified wiring layer in accordance with the retrieved placement coordinates of the logical elements, and when it is judged that there are no coordinates which permit the additional logical elements to be placed in the specified wiring layer, the method further comprises increasing, by the computer, number of specified wiring layers, and retrieving, by the computer, placement coordinates or wiring coordinates of the logical elements in a plurality of wiring layers until coordinates which permit the additional logical elements to be placed are specified.

10. The semiconductor integrated circuit designing method according to claim 9, wherein a detailed wiring path is used to judge whether there are any coordinates which permit the additional logical elements to be placed.

11. The semiconductor integrated circuit designing method according to claim 7, wherein the circuit change includes a change of wiring lines, carrying out, by the computer, the wiring of the logical elements includes judging whether there are any placement coordinates which permit wiring in the specified wiring layer in accordance with the retrieved wiring coordinates, and when it is judged that there are no wiring coordinates which permit wiring in the specified wiring layer, the method further comprises increasing, by the computer, number of specified wiring layers, and retrieving, by the computer, the wiring coordinates for a plurality of wiring layers until wiring coordinates which permit wiring are specified.

12. The semiconductor integrated circuit designing method according to claim 11, wherein a detailed wiring path is used to judge whether there are any wiring coordinates which permit the wiring.

13. The semiconductor integrated circuit designing method according to claim 7,
wherein when a wiring line which is disconnected on one end from a logical element is produced as a result of carrying out the placement or wiring of the changed logical element, the disconnected wiring line is kept intact.

14. A semiconductor device comprising:
a plurality of logical elements and a plurality of wiring lines,
the plurality of wiring lines including a wiring line which connects two of the logical elements to each other, and a wiring line which is disconnected on one end from one of the logical elements and connected on the other end to another one of the logical elements,
wherein the wiring line which is disconnected on one end from one of the logical elements and connected on the other end to another logical element is produced as a result of manufacturing the semiconductor device by use of a mask which is changed in accordance with a semiconductor integrated circuit designing method in a case of a circuit change on the semiconductor device where at least one of a logical element or a wiring line is changed after the mask to manufacture the semiconductor device has been once produced, the semiconductor integrated circuit designing method includes:
retrieving placement coordinates or wiring coordinates of the logical elements to permit wiring in a specified wiring layer for the changed logical element or the changed wiring line in accordance with circuit change information and information on a layout before the circuit change;
carrying out placement or wiring of the logical elements based on information on the retrieved placement coordinates or the retrieved wiring coordinates; and
keeping intact a wiring line which is disconnected on one end from one of the logical elements as a result of carrying out the placement or wiring of the logical elements.

15. The semiconductor device according to claim 14,
wherein the circuit change includes adding logical elements and wiring the added logical elements,
carrying out the placement or the wiring of the logical elements includes judging whether the wiring is possible in the specified wiring layer in accordance with the retrieved placement coordinates of the logical elements, and
when it is judged that the wiring is impossible in the specified wiring layer, the method further comprises increasing number of specified wiring layers, and retrieving placement coordinates or wiring coordinates of the logical elements in a plurality of wiring layers until the wiring of the added logical elements is permitted.

16. The semiconductor device according to claim 15,
wherein the change includes a circuit change of the wiring lines,
carrying out the wiring of the logical elements includes judging whether there are any placement coordinates which permit the wiring in the specified wiring layer in accordance with the retrieved wiring coordinates, and
when it is judged that there are no wiring coordinates which permit the wiring in the specified wiring layer, the method further comprises increasing number of specified wiring layers, and retrieving the wiring coordinates for a plurality of wiring layers until wiring coordinates which permit the wiring are specified.

17. The semiconductor device according to claim 16, wherein a detailed wiring path is used to judge whether there are any wiring coordinates which permit the wiring.

18. The semiconductor device according to claim 14,
wherein the circuit change includes adding additional logical elements and a changing existing wiring lines due to the additional logical elements,
carrying out the placement or the wiring of the logical elements includes judging whether there are any coordinates which permit the additional logical elements to be placed in the specified wiring layer in accordance with the retrieved placement coordinates of the logical elements, and
when it is judged that there are no coordinates which permit the additional logical elements to be placed in the specified wiring layer, the method further comprises increasing number of specified wiring layers, and retrieving placement coordinates or wiring coordinates of the logical elements in a plurality of wiring layers until coordinates which permit the additional logical elements to be placed are specified.

19. The semiconductor device according to claim 18,
wherein a detailed wiring path is used to judge whether there are any coordinates which permit the additional logical elements to be placed.

* * * * *